United States Patent
Komatsu

(10) Patent No.: US 7,020,817 B2
(45) Date of Patent: Mar. 28, 2006

(54) METHOD FOR TESTING SEMICONDUCTOR CHIPS AND SEMICONDUCTOR DEVICE

(75) Inventor: Yoshihide Komatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 416 days.

(21) Appl. No.: 10/159,024

(22) Filed: Jun. 3, 2002

(65) Prior Publication Data
US 2002/0184581 A1 Dec. 5, 2002

(30) Foreign Application Priority Data
Jun. 5, 2001 (JP) .............................. 2001-169169

(51) Int. Cl.
*G01R 31/28* (2006.01)

(52) U.S. Cl. .................................... 714/724

(58) Field of Classification Search ................ 714/724, 714/726, 729, 730, 731, 733, 734, 744; 324/158.1, 324/763, 765; 365/233
See application file for complete search history.

(56) References Cited
U.S. PATENT DOCUMENTS
6,237,115 B1   5/2001   Ting et al.
6,598,192 B1 *  7/2003  McLaurin et al. .......... 714/726
6,658,604 B1 * 12/2003  Corbin et al. ............... 714/700
6,693,436 B1 *  2/2004  Nelson ........................ 324/537

FOREIGN PATENT DOCUMENTS
JP           11-111796         4/1999

* cited by examiner

*Primary Examiner*—Albert Decady
*Assistant Examiner*—James C. Kerveros
(74) *Attorney, Agent, or Firm*—McDermott Will & Emery LLP

(57) ABSTRACT

The delay characteristic of a chip under test on which a function test is performed first is detected by performing an edge search for stabilizing the test without awaiting the delay characteristic to be stabilized and the result of detection is stored in a memory. By using the delay characteristic stored in the memory, the function test is performed repeatedly on the chip under test till NG (FAIL) occurs. When NG occurs, the function test is performed repeatedly till the NG count of the chip under test reaches a first specified number. If the NG count exceeds the first specified number, the foregoing process is repeated starting from the edge search. If the NG count reaches a second specified number, the chip under test is determined to be defective and the test is ended.

3 Claims, 8 Drawing Sheets

FIG. 5

| Address | | | | | | | | | | | |
|---|---|---|---|---|---|---|---|---|---|---|---|
| | | | 9 | 9 | 9 | 9 | 1 | 1 | 1 | 1 | 1 |
| | | | 9 | 9 | 9 | 9 | 0 | 0 | 0 | 0 | 0 |
| | | | 9 | 9 | 9 | 9 | 0 | 0 | 0 | 0 | 0 |
| | | | 7 | 8 | 9 | 9 | 0 | 0 | 0 | 1 | 2 |
| Output Pattern | X | X | X | X | X | X | X | L | L | H | H | H | →Expected Value Pattern |
| | X | X | X | X | X | X | L | H | L | L | L | H | →Add 2clk |
| | X | X | X | X | X | X | X | H | L | H | H | L | →Add 1clk |
| | X | X | X | X | X | X | X | L | L | H | H | H | →Pass |
| | X | X | X | X | X | X | X | X | H | L | H | L | →Remove 1clk |
| | X | X | X | X | X | X | X | X | X | L | L | H | →Remove 2clk |

↑ Start Expected Value

Actual Operation Pattern

If Clockwise Expected Value Exists Starting at Address 10000

- If Fail Occurs at Address 9998→Generate +2 Signal from Tester→Turn On Enable Signal For Adding Delay Circuit(s) Corresponding to 2clk→Perform Test Again

- If Fail Occurs at Address 9999→Generate +1 Signal from Tester→Turn On Enable Signal For Adding Delay Circuit(s) Corresponding to 1clk→Perform Test Again

- If Fail Occurs at Address of 10000 to 10003→Generate −1 Signal from Tester→Turn On Enable Signal For Removing Delay Circuit(s) Corresponding to 1clk→Perform Test Again

- If Fail Occurs at Address of 10000 to 10001→Generate −2 Signal from Tester→Turn On Enable Signal For Removing Delay Circuit(s) Corresponding to 2clk→Perform Test Again

METHOD FOR TESTING SEMICONDUCTOR CHIPS AND SEMICONDUCTOR DEVICE

This application claims priority to Japanese Patent Application Serial No. 2001-169169, filed Jun. 5, 2001.

BACKGROUND OF THE INVENTION

The present invention relates to an apparatus for testing semiconductor chips and to a semiconductor device.

With recent advances in the technology of CMOS ultra-miniaturization and in the technology of low-amplitude differential signal processing circuits, LSIs operating at speeds over 1 GHz, such as those compliant with the IEEE 1394b standard, have increased significantly in operating speed.

In the technology of testing an LSI which should assure the high-speed operation thereof, there is a case where the processing speed of the driver or comparator of an LSI tester is lower than the signal processing speed of the LSI. In that case, a test cannot be performed by using a normal method. No problem is encountered if the test is at the research stage. For mass production, however, a test which allows higher-speed processing speed becomes necessary.

As an example of a test method which allows higher-speed processing, there is one which uses a PLL circuit embedded in an LSI to test the LSI for high-speed transmission. To test an LSI for high-speed reception, there is another which uses a PLL circuit within the LSI in place of a circuit intended for a loop-back test or the like. The actual situation is that, to test an LSI which uses a high-speed differential transmission system as defined in the IEEE 1394 standard, a test is performed by particularly using a PLL circuit at a critical processing speed in terms of the performance of an LSI tester.

If the PLL circuit is used in a test as described above, the processing speed is increased compared with the case where the PLL circuit is not used. However, the time required for a locking period becomes about 1000-fold longer than in the case where the PLL circuit is not used. As the cause of the longer time required, the lowering of test stability due to the characteristics of the PLL circuit may be considered. FIG. 8 shows an example of the difference between an overall test time when the PLL circuit is used and an overall test time when the PLL circuit is not used. From FIG. 8, it will be understood that, if a test is performed by using the PLL circuit, the time required for an edge search, which is performed to assure test stability, is extremely long compared with the case where the PLL circuit is not used.

By thus using the PLL circuit to respond to a request for higher-speed processing during test, the test time is increased due to the lowered test stability and test cost is also increased disadvantageously.

If a low-spec LSI tester is used in the hope of increasing the processing speed and suppressing the lowering of test stability, the jitter accuracy, skew accuracy, resolution, voltage accuracy of the LSI tester are reduced considerably so that variation between different LSI testers presents a problem. This prevents indiscrete use of the low-spec LSI tester.

SUMMARY OF THE INVENTION

It is therefore an object of the present invention to provide an apparatus and method suitable for testing LSIs operating at high speeds and thereby solve the foregoing conventional problems.

The method for testing semiconductor chips according to the present invention is a method for testing semiconductor chips by using an LSI tester, the method comprising the steps of: (a) detecting a temporal correlation for at least one of the plurality of semiconductor chips on which a function test is performed and storing the correlation in a memory; (b) performing the function test on a chip under test which is the one of the plurality of semiconductor chips by using the correlation stored in the memory; and (c) performing, if the chip under test is judged to be defective in the function test, the function test again on the chip under test by using another correlation different from the correlation already used in the function test.

If the correlation is detected for at least one of the plurality of semiconductor chips on which the function test is performed in accordance with the test method, the result of detection can be used also for the function test performed on another chip under test so that the test time is reduced. If the chip under test is judged to be defective as a result of the test, the function test is performed thereon again by using the other correlation. This saves the time required to stabilize an edge search or the like, which is for detecting the correlation in the step (a), and thereby simplifies the test process. As a result, the result of the test performed on the chip under test can be judged more reliably, while the test time is reduced.

The step (c) includes detecting the correlation again for the chip under test and using the detected correlation as the other correlation. This allows a reliable test to be performed even if sufficient data on the correlations is not stored in the memory.

The step (c) includes performing the function test by using a correlation that has been detected for one of the plurality of semiconductor chips other than the chip under test and stored in the memory. This achieves a reduction in test time by using data on the correlations stored in the memory.

The step (c) includes preferentially using that one of the plurality of correlations stored in the memory which has been used with high frequency in previous function tests. This increases the probability of passing the function test and achieves a further time reduction.

The step (c) includes generating the other correlation by adding or removing a delay circuit to or from the chip under test and using the generated correlation. This allows the delay value to be changed within the semiconductor chip and thereby saves the time required to detect the correlation again.

The correlation may be detected by performing an edge search test or by measuring a delay time between inputting and outputting of a signal to and from at least one of the plurality of semiconductor chips.

The semiconductor device according to the present invention is a semiconductor device which can be tested by using a tester outputting a clock signal and a data signal, the device comprising: a PLL circuit for receiving the clock signal from the tester and outputting a doubled clock signal; a logic circuit for receiving the doubled clock signal and the data signal from the tester and outputting a test result signal; and an output timing adjusting circuit for outputting the test result signal in synchronization with the clock signal from the tester.

The arrangement allows the phase of the test result signal outputted from the semiconductor device to the tester to match the phase provided by the tester. Thus, the use of the PLL circuit during test prevents the test from becoming unstable so that a reliable test is performed.

The semiconductor device according to the present invention further comprises: an input timing adjusting circuit for supplying the clock signal outputted from the tester to the logic circuit. The arrangement also allows the phase of the test result signal to match the phase provided by the tester in the logic circuit so that a more reliable test is performed.

Preferably, each of the input timing adjusting circuit and the output timing adjusting circuit is a FIFO, DLL, or FF circuit or a circuit having a function equal to that of the FIFO, DLL, or FF circuit.

The semiconductor device according to the present invention may further comprise: a serial-to-parallel circuit for receiving the test result signal from the output timing adjusting circuit and outputting the test result signal.

The semiconductor device according to the present invention operates at a speed of 1 GHz or more. The arrangement synchronizes the shift-prone timing of outputting the test result signal with the timing provided by the tester and thereby achieves a prominent effect.

BRIEF DESCRIPTION OF THE DRAWINGS

FIG. 5 shows a specific actual operation pattern in Step ST52 according to the fourth embodiment;

DETAILED DESCRIPTION OF THE INVENTION

Embodiment 1

Figure 1:
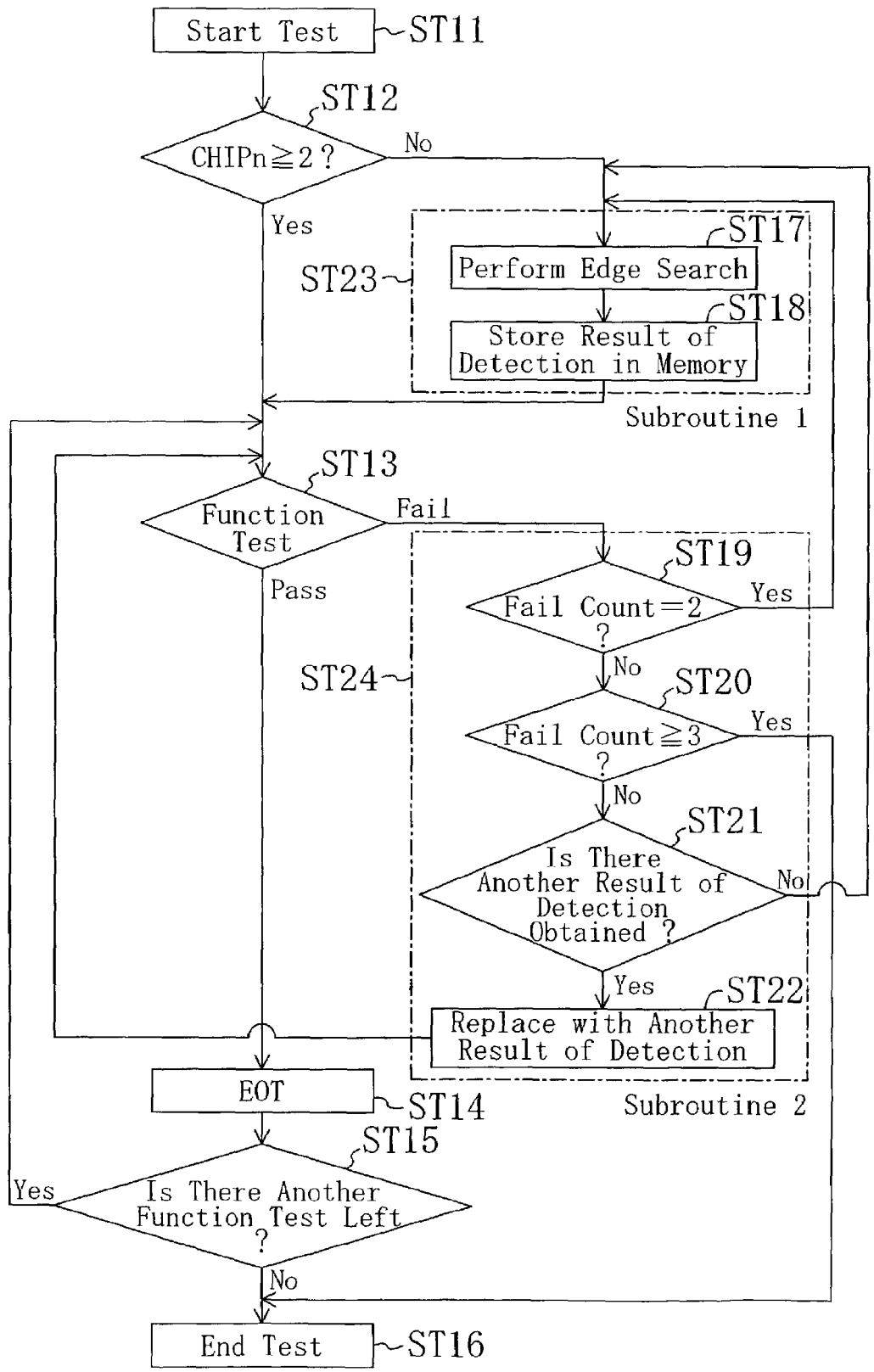
FIG. 1 is a flow chart illustrating a method for testing semiconductor chips according to a first embodiment of the present invention.

FIG. 1 is a flow chart illustrating the procedure of a method for testing semiconductor integrated circuit devices according to a first embodiment of the present invention.

First, a test is started in Step ST11. Then, in Step ST12, it is judged whether or not CHIPn≧2 is satisfied, i.e., whether or not a target device under test is the first one of the same type of devices under test on which the test is performed.

If the target device under test is the first one, NO is given as a result of judgment in Step ST12 and the process flow moves to Subroutine 1 where the process of Step ST23 is performed. Specifically, an edge search is performed in Step ST17 to detect the delay value of the target chip under test. In other words, the temporal relation between the chip under test and the delay value thereof is detected. Then, in Step ST18, the result of detection is stored in a memory. The memory stores all results of detection obtained from measurements conducted in Step S17 during test. A new result of detection obtained from the edge search is used to adjust input and output timings in a function test performed in Step ST13.

The edge search indicates the detection of the rising edge or falling edge of a clock. By detecting data on the timing of the edge, the delay value (delay characteristic) of the chip is detected. Timings with which a test pattern is inputted and the result of testing is outputted during the function test are adjusted in accordance with the result of detecting the delay value.

If the target device under test is not the first one but the third one or thereafter of the same type of devices under test on which the test is performed, YES indicative of CHIPn≧2 is given as a result of judgment. In this case, the process flow advances to Step ST13 where it is judged whether or not the result of the function test is OK (PASS) or NG (FAIL).

If the result of judgment in Step ST13 is OK (PASS), the process flow advances to Step ST14 where the function test is ended (EOT (End Of Test)). The process flow further advances to Step ST15 where it is judged whether or not another function test is left. If the result of judgment in Step ST15 is NO, the test is ended. If the result of judgment in Step ST15 is YES, the process of Step ST13 to Step ST15 is repeated.

If the result of judgment in Step ST13 is NG (FAIL), the process flow moves to Subroutine 2. In Subroutine 2, the process flow moves first to Step ST19 where it is judged whether or not the number of times that FAILs occurs (FAIL count) is 2. If the result of judgment is YES, the process flow advances to Step ST23 where the aforementioned edge search is performed and the result of detection is stored in the memory. Then, the function test performed in Step ST13 is performed again.

If the result of judgment in Step ST19 is NO, the process flow advances to Step ST20 where it is judged whether or not the FAIL count is 3 or more. If the result of judgment in Step ST20 is YES, the test is ended. If the result of judgment in Step ST20 is NO, i.e., if the FAIL count is 1, the process flow advances to Step ST21 where it is judged whether or not the same result of detection has been obtained from an edge search performed on another one of the same type of devices under test. If the result of judgment in Step ST21 is YES, the process flow advances to Step ST22 where the function test is performed again on the target chip under test by replacing a signal from the tester such that the tester is ready for another result of detection. If the result of judgment in Step ST21 is NO, the process flow moves to Step ST23.

In the present embodiment, it is judged in Step ST12 whether or not the target device under test is the first one of the same type of devices under test on which the test is performed. If the target device under test is not the first one, the edge search can be omitted. Since the result of detection obtained from the edge search can be stored in Step ST18, once the result of detection obtained from the edge search is stored, the stored result is usable in the subsequent function tests. Compared with the conventional method which uniformly performs an edge search, the method according to the present embodiment achieves a reduction in test time.

In addition, the present embodiment achieves the following effect if NG (FAIL) occurs in the function test performed in Step ST13. If the NG (FAIL) count in the test is 1, a replacement with another result of detection is carried out in Step ST22 or the edge search is performed again in Step ST23. After the result of detection is stored in the memory, the function test is performed again in ST13. If the NG (FAIL) in the test is 2, the edge search is performed again in Step ST23. After the result of detection is stored, the function test is performed again in Step 13. If the NG (FAIL) count in the test is 3 or more, the target chip under test is judged to be defective so that the test is ended. By thus performing a proper process in accordance with the NG (FAIL) count, reliable judgment can be performed.

In an LSI operating at a speed over 1 GHz, the timing of outputting a signal is prone to a shift. Although such an LSI has specifications which allow communication between LSIs operating in non-synchronization, it is necessary to synchronize a signal from a tester with a signal from the LSI during test. As a result, there is a case where an LSI with no defect is judged to be defective during test due to shifted timing. According to the present embodiment, however, the LSI that has been judged to be defective in the function test can be subjected to the function test performed again by using another result of detection. This allows a more reliable PASS/FAIL judgment to be performed in a shorter period of time.

Embodiment 2

Figure 2:
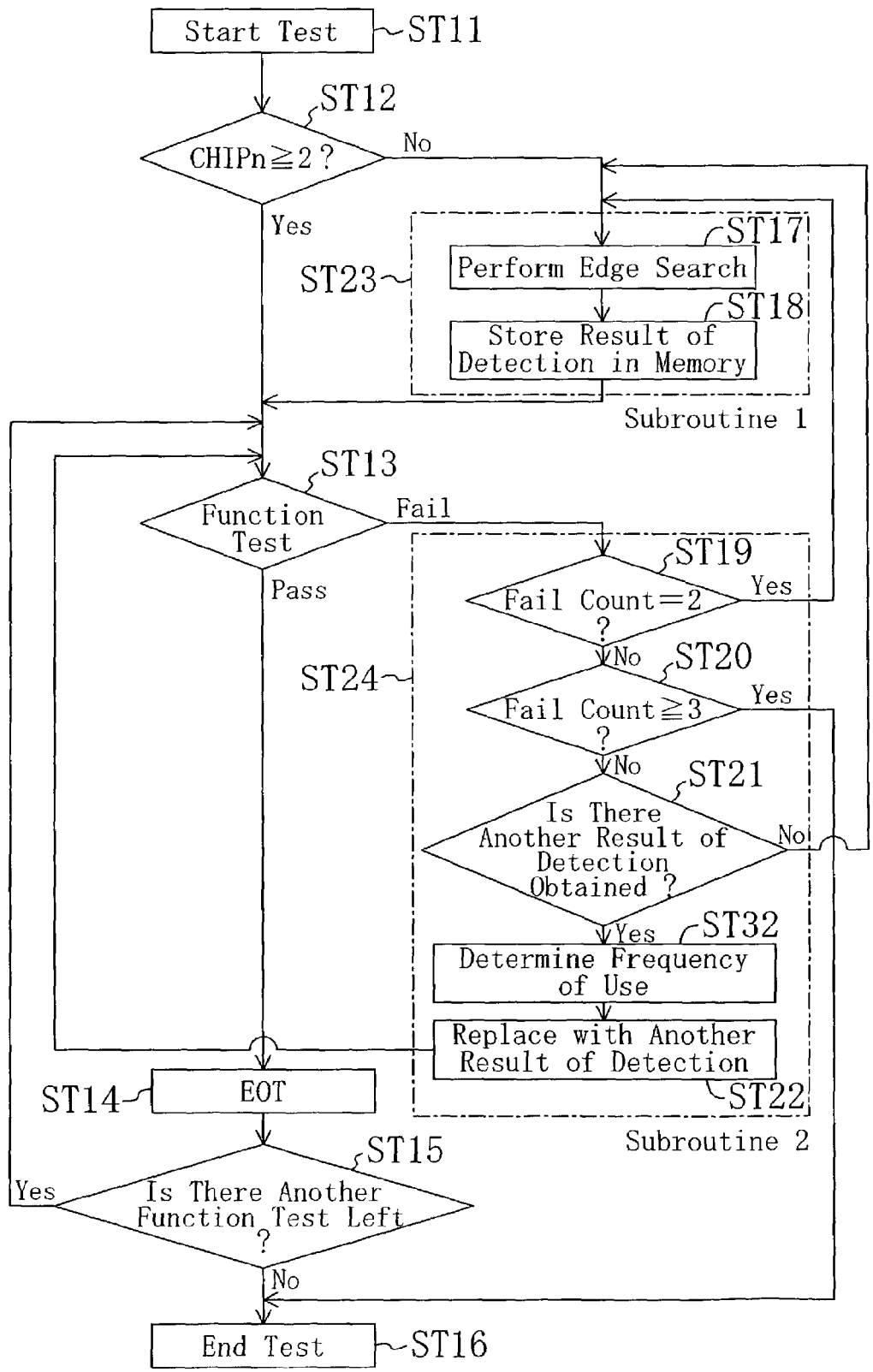
FIG. 2 is a flow chart illustrating a method for testing semiconductor chips according to a second embodiment of the present invention.

A second embodiment of the present invention will be described with reference to the drawings. FIG. 2 is a flow chart illustrating the procedure of a method for testing semiconductor integrated circuit devices according to the second embodiment. As shown in FIG. 2, the testing method according to the present embodiment is obtained by providing Step ST32 between Steps ST21 and ST22 in the test method according to the first embodiment.

If a test is performed in accordance with the method of the present embodiment, the same effects achieved in the first embodiment are achievable. In addition, the present embodiment determines the frequencies of use of the results of detection obtained from previous edge searches performed with respect to the devices under test in Step ST32. In Step ST22, the present embodiment can also replace the result of detection obtained from an edge search that has failed in the function test with the result of detection used most frequently. If the highest frequency of use of the result of detection is judged to be 5 in Step ST32, the original result of detection is replaced with the result of detection that has been judged to have a frequency of use of 5. Since the result of detection used most frequently has the highest probability of passing the function test, the probability that the test fails lowers accordingly. This achieves a reduction in test time.

Embodiment 3

Figure 3:
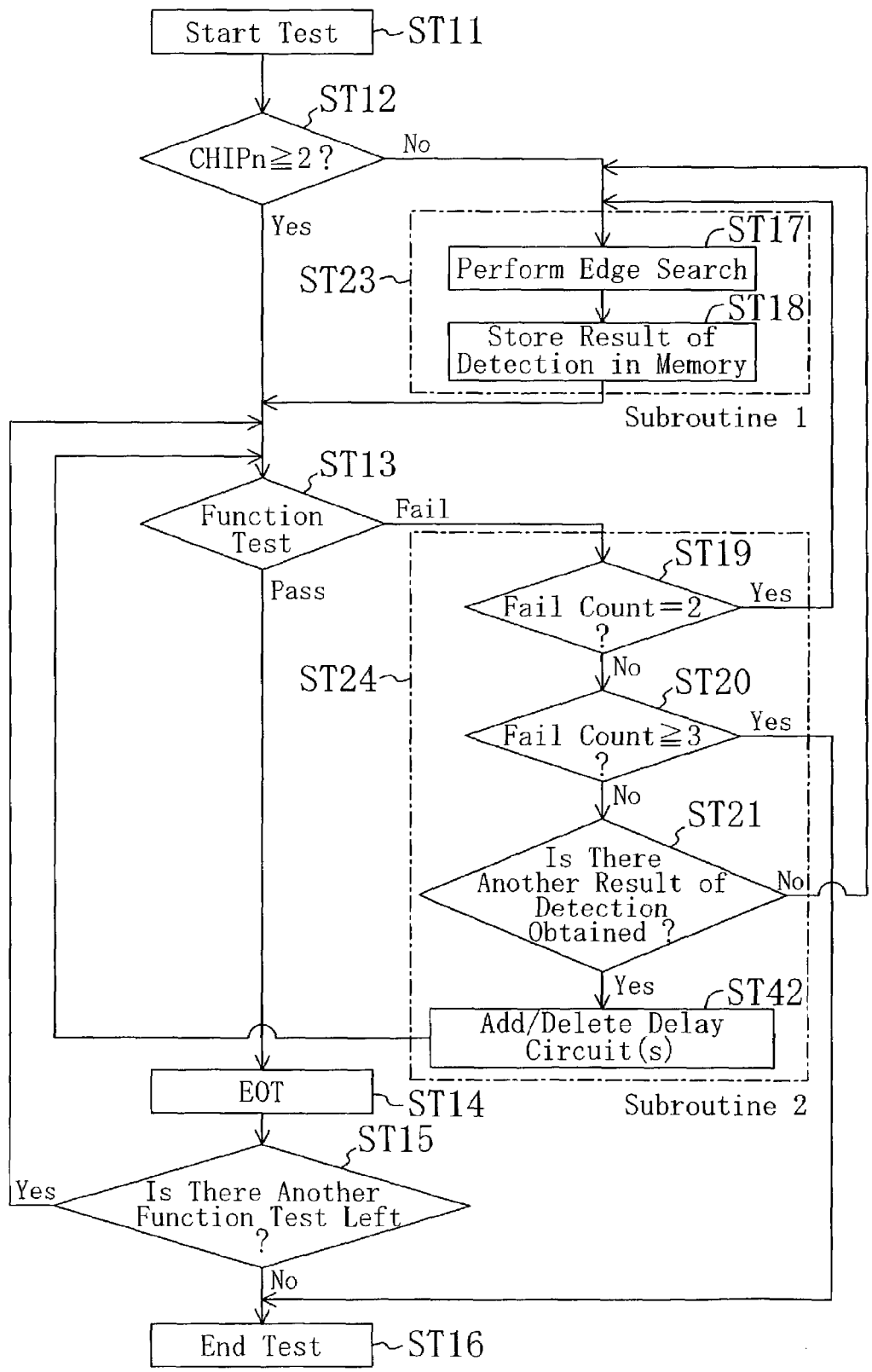
FIG. 3 is a flow chart illustrating a method for testing semiconductor chips according to a third embodiment of the present invention.

A third embodiment according to the present invention will be described with reference to FIG. 3. FIG. 3 is a flow chart illustrating the procedure of a method for testing semiconductor integrated circuit devices according to the third embodiment. As shown in FIG. 3, the test method according to the present embodiment is obtained by providing Step ST42 in which a delay circuit or circuits are added or removed to or from the target chip under test in place of Step ST22 in accordance with the test method according to the first embodiment.

If a test is performed in accordance with the present embodiment, the same effects as achieved in the first embodiment are achievable. In addition, the following effects are also achieved.

In the chip under test, the delay circuit is composed of an inverter chain consisting of a plurality of inverters connected to each other. In Step S42, a signal is sent from the tester to adjust the number of the inverters used to constitute the delay circuit in accordance with the delay time and thereby add or delete the delay circuit. This allows the delay value to be adjusted within the chip under test so that the probability that the test fails is reduced and the test time is reduced.

Embodiment 4

Figure 4:
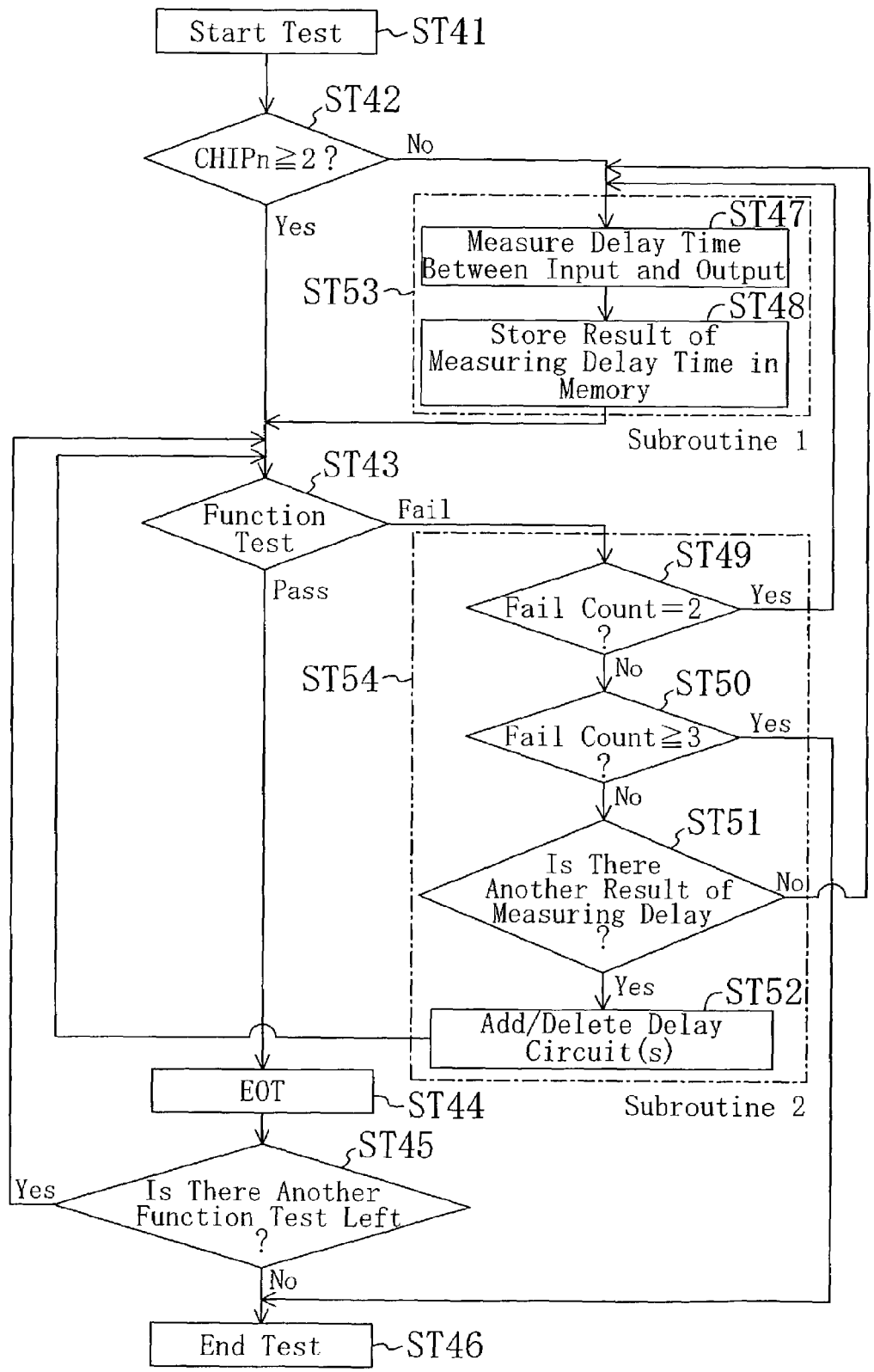
FIG. 4 is a flow chart illustrating a method for testing semiconductor chips according to a fourth embodiment of the present invention.

FIG. 4 is a flow chart showing the procedure of a method for testing semiconductor integrated circuit devices according to a fourth embodiment of the present invention.

At first, a test is started in Step ST41. In Step ST42, it is judged whether or not CHIPn≧2 is satisfied, i.e., whether or not a target device under test is the first one of the same type of devices under test on which the test is performed.

If the target device under test is the first one, "NO" is given as a result of judgment in Step ST42 and the process flow moves to Subroutine 1 where the process of Step ST53 is performed. Specifically, the delay time between the inputting and outputting of data to and from the target chip under test is measured in Step ST47. Then, in Step ST48, the measured delay time is stored in a memory. The memory stores all delay times measured in Step S47 during test. A newly measured delay time is used to adjust input and output timings in a function test performed in Step ST43.

If the target device under test is the second one or thereafter on which the test is performed, YES indicative of CHIPn≧2 is given as a result of judgment in Step ST42. In that case, the process flow advances to Step ST43 where it is judged whether or not the result of the function test is OK (PASS) or NG (FAIL).

If the result of judgment in Step ST43 is OK (PASS), the process flow advances to Step ST44 where the function test is ended (EOT (End Of Test)). The process flow further advances to Step ST45 where it is judged whether or not another function test is left. If the result of judgment in Step ST45 is NO, the test is ended. If the result of judgment in Step ST45 is YES, the process of Step ST43 to Step ST45 is repeated.

If the result of judgment in Step ST43 is NG (Fail), the process flow moves to Subroutine 2. In Subroutine 2, the process flow moves first to Step ST49 where it is judged whether or not the FAIL count is 2 or more. If the result of judgment is YES, the process flow advances to Step ST53 where the delay time is measured as described above and the result of measurement is stored in the memory. Then, the function test performed in Step ST43 is performed again.

If the result of judgment in Step ST49 is NO, the process flow advances to Step ST50 where it is judged whether or not the FAIL count is 3 or more. If the result of judgment is YES, the test is ended. If the result of judgment in Step ST50 is NO, i.e. if the FAIL count is 1, the process flow advances to Step ST51 where it is judged whether or not another result of measuring a delay time exists. If the result of judgment in Step ST51 is YES, the process flow advances to Step ST52 where a delay circuit or circuits are added or removed to or from the chip under test such that the function test is performed again on the chip under test. If the result of judgment in Step ST51 is NO, the process flow moves to Step ST53.

FIG. 5 shows a specific example of an actual operation pattern in Step ST52 in the present embodiment. In the example shown in FIG. 5, a delay circuit or circuits are added or removed within the range of plus and minus 2 where shifted timing easily occur.

In FIG. 5, it is assumed that a clock pattern exists at addresses of 10000 or more. If the test fails at the address 9998, a +2 signal is generated from the tester so that a delay circuit or circuits corresponding to 2 clocks are added in Step ST52. If the test fails at the address 9999, a +1 signal is generated from the tester so that a delay circuit or circuits corresponding to one clock are added in Step ST52. If FAIL occurs at each of the addresses of 10001 to 10003, a −1 signal is generated from the tester so that a delay circuit or circuits corresponding to 1 clock are removed in Step ST52. If FAIL occurs at each of the addresses of 100000 to 10001, a −2 signal is generated from the tester so that a delay circuit or circuits corresponding to 2 clocks are removed in Step ST52. After the delay circuit or circuits are thus added or removed in Step ST52, the function test is performed again in Step ST43.

Since the present embodiment can control the delay time within the circuit on a per clock basis, the same operation as in an expected clock pattern is provided in the output pattern of the chip under test. This lowers the probability that FAIL occurs and prevents the lowering of a production yield dependent on a test method.

In a clock recovery circuit used in the majority of high-speed LSIs, the lowered production yield does not cause a problem during actual operation. If the production yield lowers at the research stage, however, a problem arises so that it is useful to prevent the lowered production yield as described above.

The present embodiment can also achieve the same effects as achieved in the first embodiment. That is, the present embodiment achieves a shorter test time and a more reliable PASS/FAIL judgment than achieved in accordance with the conventional method.

The actual operation pattern shown in FIG. 5 may also be used in Step ST42 of the third embodiment.

It is also possible to use Steps ST47 and ST48 of the present embodiment for Steps ST17 and ST18 of the second embodiment.

Embodiment 5

Figure 6:
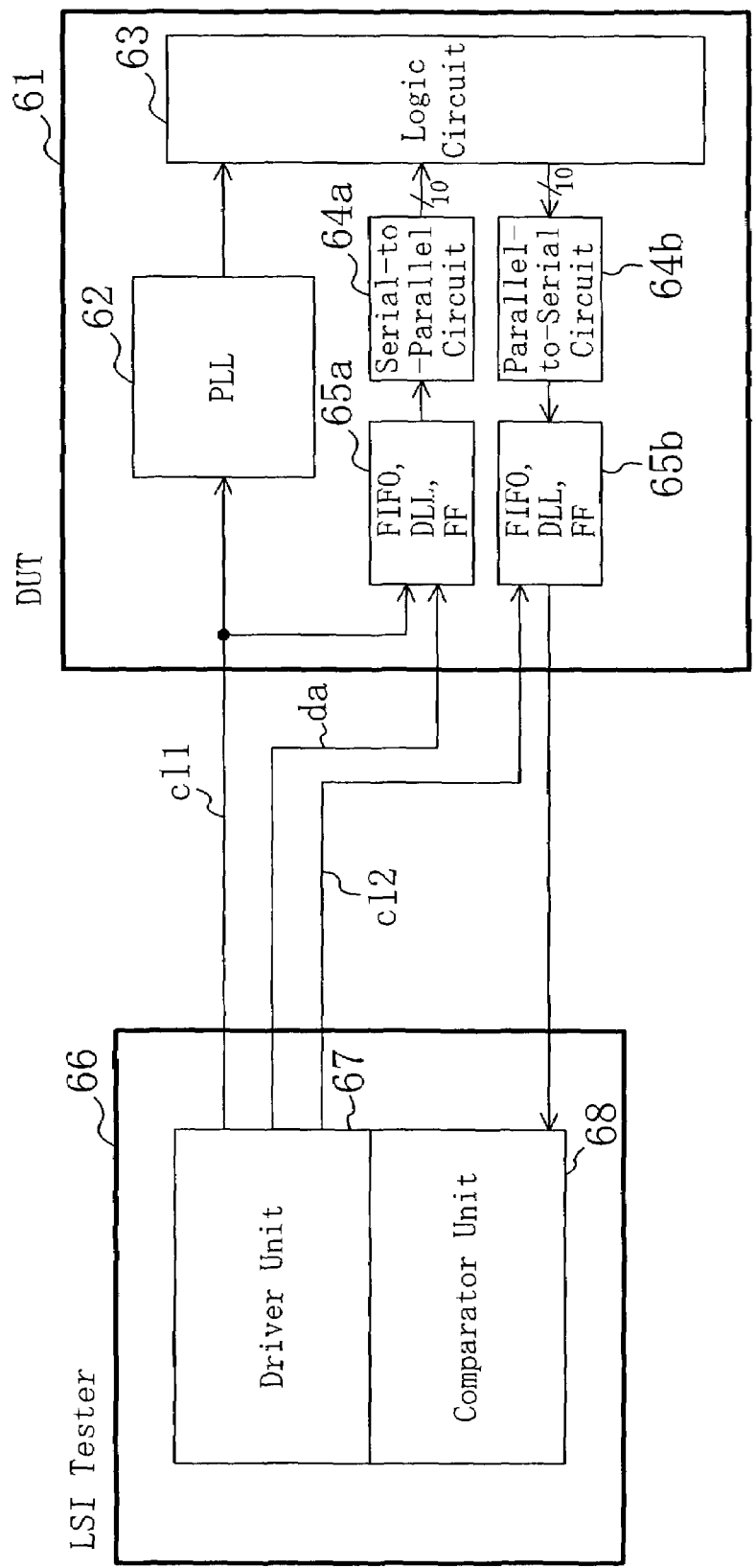
FIG. 6 shows a structure of a test circuit according to a fifth embodiment of the present invention.

FIG. 6 is a circuit diagram showing a test circuit according to a fifth embodiment of the present invention. As shown in FIG. 6, a test system (test circuit) according to the present embodiment is composed of: an LSI tester 66; and a device under test (DUT) 61. The LSI tester 66 is composed of: a driver unit 67; and a comparator (driven) unit 68. The device under test 61 is composed of: a PLL circuit 62; a logic circuit 63; a serial-to-parallel circuit 64*a*; a parallel-to-serial circuit 64*b*; and boxes 65*a* and 65*b* each having a FIFO circuit, a DLL circuit, or a FF circuit embedded therein.

The operation of the test circuit according to the present embodiment will be described with reference to FIG. 6. First, test signals are outputted from the driver unit 67 of the LSI tester 66 to the device under test 61. The test signals include clock signals c11 and c12 and a data signal da.

Of the test signals, the clock signal c11 is doubled by the PLL circuit 62 and reaches the logic circuit 63.

Of the test signals, the clock signal c11 and the data signal da are inputted to the box 65*a* (input timing adjusting circuit). Since the box 65*a* has a circuit for providing timing to data from the FIFO circuit, the DLL circuit, the FF circuit, and the like, the timing of outputting the clock signal c11 is synchronized with timing provided by the tester 66. The output signal from the box 65*a* is subjected to a serial-to-parallel conversion in the serial-to-parallel circuit 64*a* and reaches the logic circuit 63.

From the logic circuit 63, a test result signal based on the data signal da is outputted in timed relation with the doubled signal from the PLL circuit 62. The test result signal is converted to a parallel-to-serial conversion in the parallel-to-serial circuit 64*b* and reaches the box 65*b*.

The test result signal that has reached the box 65*b* is outputted to the comparator unit of the tester 66. The outputting of the test result signal is synchronized by the clock signal c12 inputted from the tester 66 to the box 65*b* (output timing adjusting circuit) with the timing provided by the tester 66.

The foregoing test method allows the phase of the test result signal outputted from the device under chip (DUT) 61 to the tester 66 to match the phase provided by the tester. Thus, the use of the PLL circuit for the test prevents the test from becoming unstable.

In the present invention, both of the boxes 65*a* and 65*b* need not necessarily be provided. Even if either one of the boxes 65*a* and 65*b* is provided, the present invention is effective.

Embodiment 6

Figure 7:
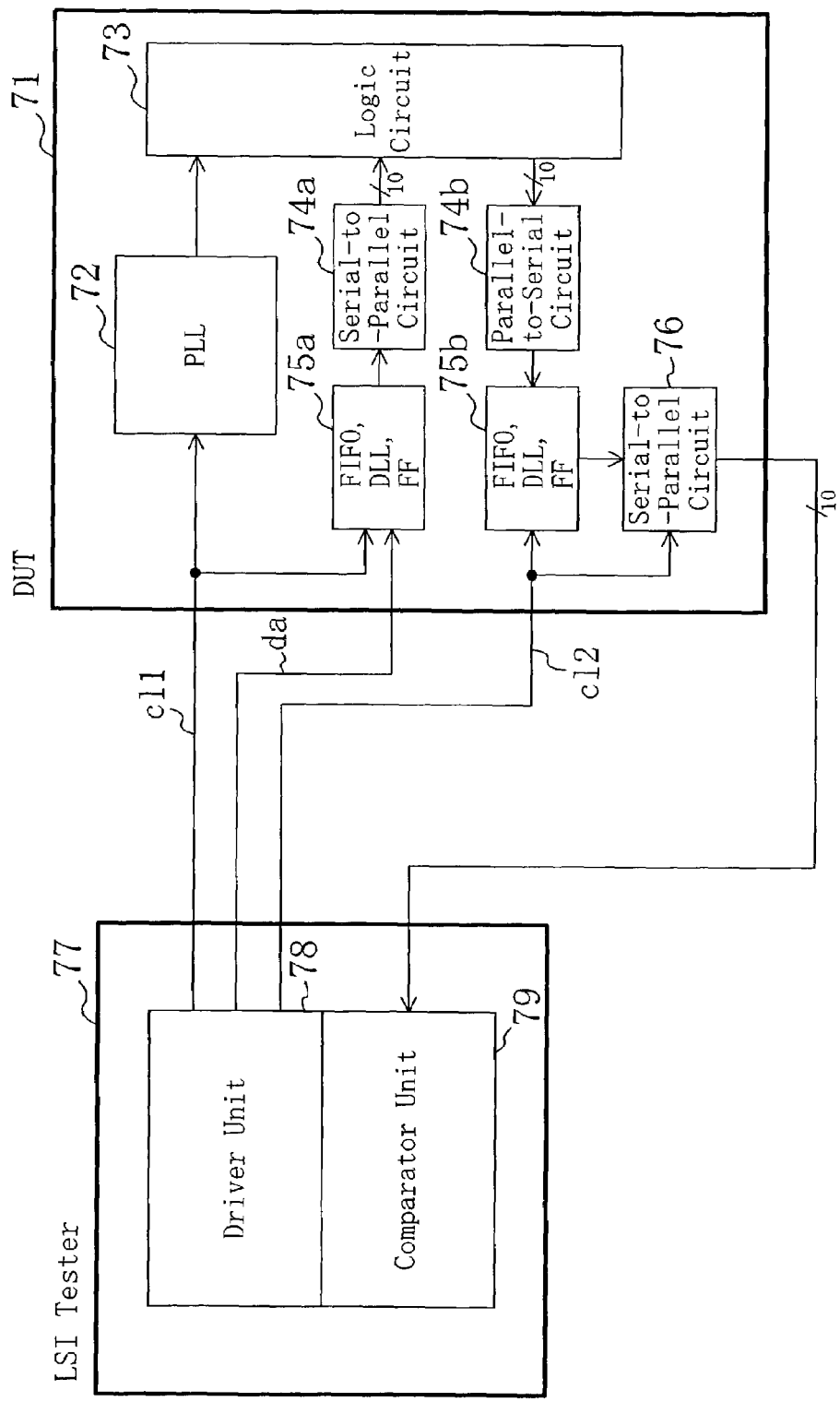
FIG. 7 shows a structure of a test circuit according to a sixth embodiment of the present invention.
Figure 8:
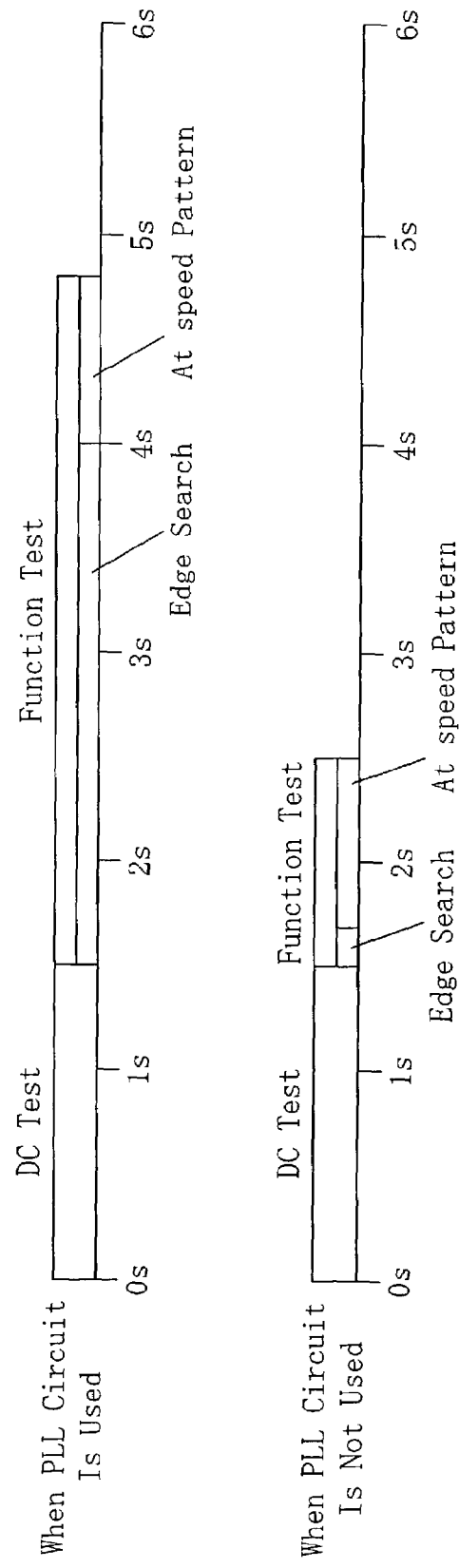
FIG. 8 shows an example of a time required to test a conventional semiconductor device.

FIG. 7 is a circuit diagram showing a test circuit according to a sixth embodiment of the present invention. As shown in FIG. 7, a test system (test circuit) according to the present embodiment is composed of: an LSI tester 77; and a device under test (DUT) 71. The LSI tester 77 is composed of: a driver unit 78; and a comparator unit 79. The device under test 71 is composed of: a PLL circuit 72; a logic circuit 73; a serial-to-parallel circuit 74*a*; a parallel-to-serial circuit 74*b*; boxes 75*a* and 75*b* each having a FIFO circuit, a DLL circuit, or a FF circuit embedded therein; and a serial-to-parallel circuit 76.

The operation of the test circuit according to the present embodiment will be described with reference to FIG. 7. First, test signals are outputted from the driver unit 78 of the LSI tester 77 to the device under test 71. The test signals include clock signals c11 and c12 and a data signal da.

Of the test signals, the clock signal c11 is doubled by the PLL circuit 72 and reaches the logic circuit 73.

Of the test signals, the clock signal c11 and the data signal da are inputted to the box 75*a* (input timing adjusting circuit). Since the box 75*a* has a circuit for providing timing to data from the FIFO circuit, the DLL circuit, the FF circuit, and the like, the timing of outputting the clock signal c11 is synchronized with timing provided by the tester 77. The output signal from the box 75*a* is subjected to a serial-to-parallel conversion in the serial-to-parallel circuit 74*a* and reaches the logic circuit 73.

From the logic circuit 73, a test result signal based on the data signal da is outputted in timed relation with the doubled signal from the PLL circuit 72. The test result signal is converted to a parallel-to-serial conversion in the parallel-to-serial circuit 74*b* and reaches the box 75*b*.

The test result signal that has reached the box 75*b* is synchronized by the clock signal c12 inputted from the tester 77 to the box 75*b* (output timing adjusting circuit) with the timing provided by the tester 77. The test result signal is subjected to a serial-to-parallel conversion in the serial-to-parallel circuit 76. Since the clock signal c12 from the tester 77 is inputted at this time to the serial parallel circuit 76, the phase of the test result signal matches the phase provided by the tester more reliably.

Thereafter, the test result signal is outputted to the comparator unit of the tester 77. The serial-to-parallel circuit 76 is used only for the test.

What is claimed is:

1. A method for testing semiconductor chips by using an LSI tester, the method comprising the steps of:
   (a) detecting a temporal correlation for at least one of the plurality of semiconductor chips on which a function test is performed and storing the correlation in a memory;
   (b) performing the function test on a chip under test which is one of the plurality of semiconductor chips by using the correlation stored in the memory; and
   (c) performing, if the chip under test is judged to be defective in the function test, the function test on the chip under test by using another correlation different from the correlation already used in the function test,
   wherein the step (c) includes performing the function test by using a correlation that has been detected for one of the plurality of semiconductor chips other than the chip under test stored in the memory, and
   wherein the step (c) includes preferentially using one of the correlations stored in the memory which has been used with high frequency in previous function tests.

2. The method of claim 1, wherein the step (c) includes generating the other correlation by adding or removing a delay circuit to or from the chip under test and using the generated correlation.

3. The method of claim 1, wherein the correlation is detected by performing an edge search test.

* * * * *